United States Patent [19]

Okada et al.

[11] Patent Number: 5,018,158
[45] Date of Patent: May 21, 1991

[54] SEMICONDUCTOR LASER DEVICE

[75] Inventors: Masato Okada; Masaki Kohno; Tetsuya Yagi, all of Itami, Japan

[73] Assignee: Mitsubishi Denki Kabushiki Kaisha, Japan

[21] Appl. No.: 472,290

[22] Filed: Jan. 30, 1990

[30] Foreign Application Priority Data

Feb. 1, 1989 [JP] Japan .................................. 1-24452

[51] Int. Cl.$^5$ ............................................... H01S 3/19
[52] U.S. Cl. ........................................ 372/46; 372/45
[58] Field of Search .................................... 372/46, 45

[56] References Cited

U.S. PATENT DOCUMENTS

| | | | |
|---|---|---|---|
| 4,371,966 | 2/1983 | Scifres et al. | 372/45 |
| 4,849,372 | 7/1989 | Takemoto | 437/129 |
| 4,916,709 | 4/1990 | Ota et al. | 372/46 |
| 4,961,197 | 10/1990 | Tanaka et al. | 372/45 |
| 4,964,135 | 10/1990 | Mitsui et al. | 372/46 |

FOREIGN PATENT DOCUMENTS 60-101989  6/1985  Japan .

OTHER PUBLICATIONS

Mawst et al., "Complementary Self-Aligned . . . Deposition", Electronics Letters, Sep. 26, 1985, vol. 21, No. 20, pp. 903-905.

Primary Examiner—Georgia Epps
Attorney, Agent, or Firm—Leydig, Voit & Mayer

[57] ABSTRACT

A semiconductor laser device includes an n type first cladding layer and a multi quantum well active layer successively grown on an n type substrate, a p type second cladding layer having a stripe ridge narrower in the neighborhood of the laser cavity facets than within the laser disposed on the active layer, a p type buffer layer containing p type dopants in a higher concentration than in the second cladding layer and disposed on the second cladding layer except on the stripe ridge, an n type current blocking layer disposed on the buffer layer, and a p type contact layer disposed on an upper surface of the stripe ridge and the second cladding layer and the current blocking layer, the multi quantum well being disordered except directly opposite the wider portion of the stripe ridge by the diffusion of p type dopant impurities from the p type buffer layer.

3 Claims, 6 Drawing Sheets

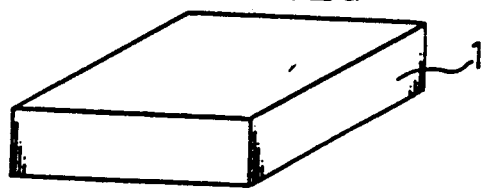
FIG.2a
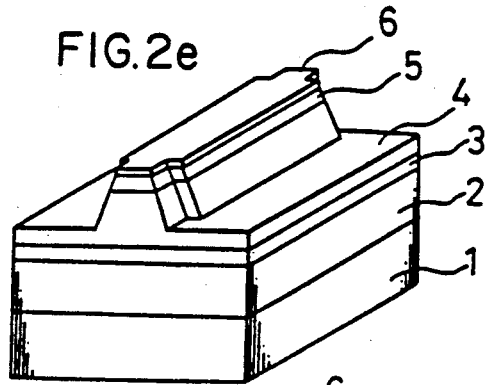
FIG.2e
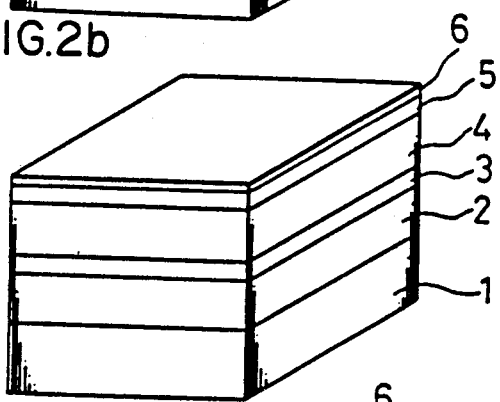
FIG.2b
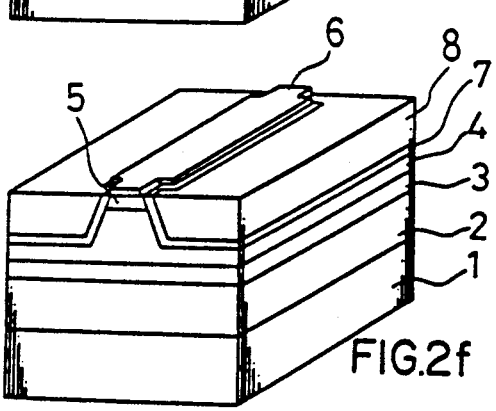
FIG.2f
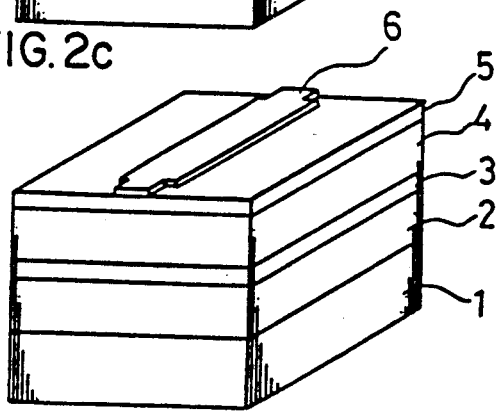
FIG.2c
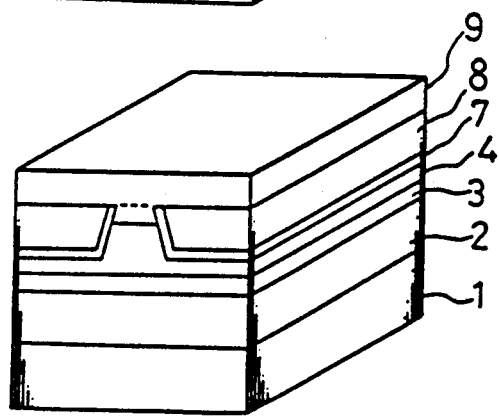
FIG.2g
FIG.2d

SEMICONDUCTOR LASER DEVICE

FIELD OF THE INVENTION

The present invention relates to a semiconductor laser device and a production method thereof and, more particularly, to increasing the COD level of the laser.

BACKGROUND OF THE INVENTION

FIG. 6 shows a prior art semiconductor laser. In FIG. 6, reference numeral 1 designates an n type GaAs substrate. N type $Al_xGa_{1-x}As$ first cladding layer 2 is disposed on the substrate 1. Undoped $Al_qGa_{1-q}As$ ($q<x$) active layer 3' is disposed on the first cladding layer 2. P type $Al_xGa_{1-x}As$ second cladding layer 4 having a stripe shaped ridge 10' which has a uniform width is L disposed on the active layer 3'. N type GaAs current blocking layer 8 is disposed on layer 4 except for the top surface of the stripe shaped ridge 10' of the second cladding layer 4. P type GaAs contact layer 9 is disposed on the stripe shaped ridge 10' of the second cladding layer 4 and the current blocking layer 8.

The device will operate as follows.

When a bias is applied between the p type GaAs contact layer 9 and the n type GaAs substrate 1, a thyristor is constituted by the n type first cladding layer 2, the undoped $Al_xGa_{1-x}As$ active layer 3', the p type $Al_xGa_{1-x}As$ second cladding layer 4, the n type GaAs current blocking layer 8, and the p type GaAs contact layer 9, and a current only flows through the stripe shaped convex 10' of the p type $Al_xGa_{1-x}As$ second cladding layer 4. The arrows 11 in FIG. 6 show the a path of this current. By that current flow, electrons and holes are injected into the undoped $Al_xGa_{1-x}As$ active layer 3' to and recombine radiate light. When the current is increased, laser oscillation starts. The laser light is confined, in the up and downward direction of the laser device, by the effective refractive index difference between the undoped $Al_xGa_{1-x}As$ active layer 3' or the n type $Al_xGa_{1-x}As$ first cladding layer 2 or the p type $Al_xGa_{1-x}As$ second cladding layer 4 and, in the transverse direction of laser device, by the guide produced by the refractive index difference between the cladding layer 4 and the n type GaAs current blocking layer 8 which absorbs light. Thus, the light is effectively guided inside the laser device.

FIG. 4 shows the relationship between the injection current and the light output in the semiconductor laser device. As shown in this figure, when the injection current is increased, destruction due to light absorption at the laser facet, that is, so-called Catastrophic Optical Damage (COD) occurs at the current injection level of point A in the figure, and the laser is destroyed. In order to enhance the power output level at which COD arises (COD level), the light density at the active layer may be decreased by reducing the thickness of the active layer or reducing the reflectance of the laser facet at the laser output side while increasing the reflectance at the opposite side, that is, with asymmetric reflection coatings However, when the active layer is made thin, the threshold current for laser oscillation rapidly increases as shown in FIG. 5 and there is a practical limit to reducing active layer thickness. Further, when the reflectance of the laser device facet is reduced, the influence of optical feedback of the emitted light from the outside is increased and the noise characteristics of the suffer. Further, by the increasing of the external differential efficiency, the light output is significantly modulated by slight variations in the injection current.

FIG. 7 shows a prior art semiconductor laser device which has an enhanced COD level and uses a superlattice active layer disordered by an impurity diffusion as disclosed in the Japanese Published Patent Application 60-101989. In FIG. 7, reference numeral 1 designates an n type GaAs substrate. N type $Al_xGa_{1-x}As$ first cladding layer 2 is disposed on the n type GaAs substrate 1. Superlattice layer 3 comprising N+1 GaAs quantum well layers and N $Al_yGa_{1-y}As$ barrier layers is disposed on the first cladding layer 2. P type $Al_xGa_{1-x}As$ second cladding layer 4 is disposed on the superlattice layer 3. P type GaAs contact layer 5 is disposed on the second cladding layer 4. Reference numeral 13 designates the neighborhood of the cavity facet which has become a uniform mixed crystal due to the Zn diffusion. Reference numerals 14 and 15 designates a p side and an n side electrode, respectively.

The production process will be described.

First of all, an n type $Al_xGa_{1-x}As$ first cladding layer 2, a superlattice layer 3, a p type $Al_xGa_{1-x}As$ second cladding layer 4, and a p type GaAs contact layer 5 are successively epitaxially grown on a GaAs substrate 1. Thereafter, a silicon nitride film or a silicon oxide film is deposited on the entire surface of wafer and this film is patterned to produce a plurality of stripe shaped apertures along the region becoming the cleavage planes. Next, using the patterned film as a mask, Zn is diffused from the stripe shaped apertures. The superlattice layer 3 inside the region 13 into which Zn is diffused is disordered, and it becomes a $Al_{y'}Ga_{1-y'}As$ mixed crystalline layer having a larger band gap than the transition energy between the bottom levels of the quantum well of the superlattice 3. Thereafter, the wafer is cleaved into chips at the neighborhood of the central portion thereof along the stripes of the apertures.

In this laser device, a multi-quantum, well structure is used as an active layer and by increasing the energy band gap only the neighborhood of the facet of the active layer, the, light absorption loss at that portion is lowered, thereby increasing the COD level.

In this prior art device, the COD levels can be increased without lowering the light density at the active layer by thinning the active layer or by lowering the light density inside the laser device by asymmetric reflection coating which lowers the reflectance of cavity facet at the light output side and increases the same at the opposite side thereof. Accordingly, the above-described problems can be solved.

The prior art laser device thus constructed has increased the COD level by disordering the superlattice active layer with an impurity diffusion In this prior art laser device, however, the light confinement in the transverse direction inside the active layer is not considered. As the light confinement in the transverse direction inside the active layer, the loss guide type shown in the prior art of FIG. 6 is thought of. However, in a case where the construction of FIG. 6 is combined with the construction of FIG. 7, the production process becomes quite difficult because an increased number of photolithography steps are required Further, in producing the electrodes, the mask which becomes a diffusion mask in the production process of the device of FIG. 7 must be removed. When the diffusion mask is removed, it is quite difficult to distinguish the diffusion region from the other region and to determine the positions to be cleaved._

SUMMARY OF THE INVENTION

It is an object of the present invention to provide a semiconductor laser device having a high COD level and a simple production methods therefor.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

According to an aspect of the present invention, a semiconductor laser device includes an n type first cladding layer and an n type or p type or intrinsic multi quantum well active layer successively grown on an n type substrate, a p type second cladding layer having a stripe region extending in the cavity length direction having a narrower width in the neighborhood of the facet than inside the laser disposed on the active layer, a p type buffer layer containing p type impurities in a higher concentration than the second cladding layer disposed on the second cladding layer except on the top of the stripe ridge of the second cladding layer, an n type current blocking layer disposed on the buffer layer, and a p type contact layer disposed on the top surface of the ridge stripe of the second cladding layer and the current blocking layer, and the multi quantum well layer, except directly below the wider stripe ridge disordered by diffusion the p type dopant from the p type buffer layer.

Therefore, the band gap energy is increased to a value higher than the photon energy which is amplified by the active layer comprising a multi quantum well layer inside the laser device, and the photons are not absorbed at the laser facet and COD is not likely to occur.

According to another aspect of the present invention, a production method of a semiconductor laser device includes growing an n type first cladding layer, an n type or p type or intrinsic multi quantum well layer, a p type second cladding layer, and a p type GaAs cap layer successively on an n type substrate, etching the p type cap layer and the p type second cladding layer in a stripe shape having a narrower width at the laser cavity facet than at the inside thereof, epitaxially growing a p type buffer layer containing p type dopants in to a higher, concentration than the p type second cladding layer on the second cladding layer and an n type current blocking layer except on the top surface of the p type cap layer of the stripe ridge, epitaxially growing a p type contact layer on the p type cap layer of the stripe shaped convex portion and on the n type current blocking layer, and in the second and third epitaxial growth processes, disordering the multi quantum well layer except for a directly below the width portion of the stripe shaped convex portion of the active layer p type impurities from the p type buffer layer.

Therefore, a semiconductor laser device of a loss guide type utilizing a ridge can be obtained by disordering the multi quantum well active layer in the neighborhood of the laser facet by quite a simple process.

According to a further aspect of the present invention, a production method of a semiconductor laser device includes successively growing an n type first cladding layer, an n type or p type or intrinsic multi quantum well layer, a p type second cladding layer, and a p type cap layer on an n type substrate, etching the p type cap layer and the p type second cladding layer in a stripe shape having a narrower width at the laser cavity facet than at the inside of the laser, disordering the, multi quantum well layer except directly below a wider portion of the stripe ridge of the active layer by diffusing p type dopants, epitaxially growing, an n type current blocking layer other than on the upper surface of the stripe ridge of the p type cap layer, and epitaxially growing a p type contact layer on the p type cap layer of the stripe ridge and the n type current blocking layer.

Therefore, a semiconductor laser device of a loss guide type utilizing a ridge can be obtained with the multi quantum well active layer being disordered at the neighborhood of the laser facet by a simple process while precisely controlling the diffusion.

BRIEF DESCRIPTION OF THE DRAWINGS

FIGS. 2(a) to 2(g) are diagrams showing a production process of the device of FIG. 1;

DETAILED DESCRIPTION OF THE PREFERRED EMBODIMENTS

An embodiment of the present invention will be described in detail with reference to the drawings.

Figure 1:
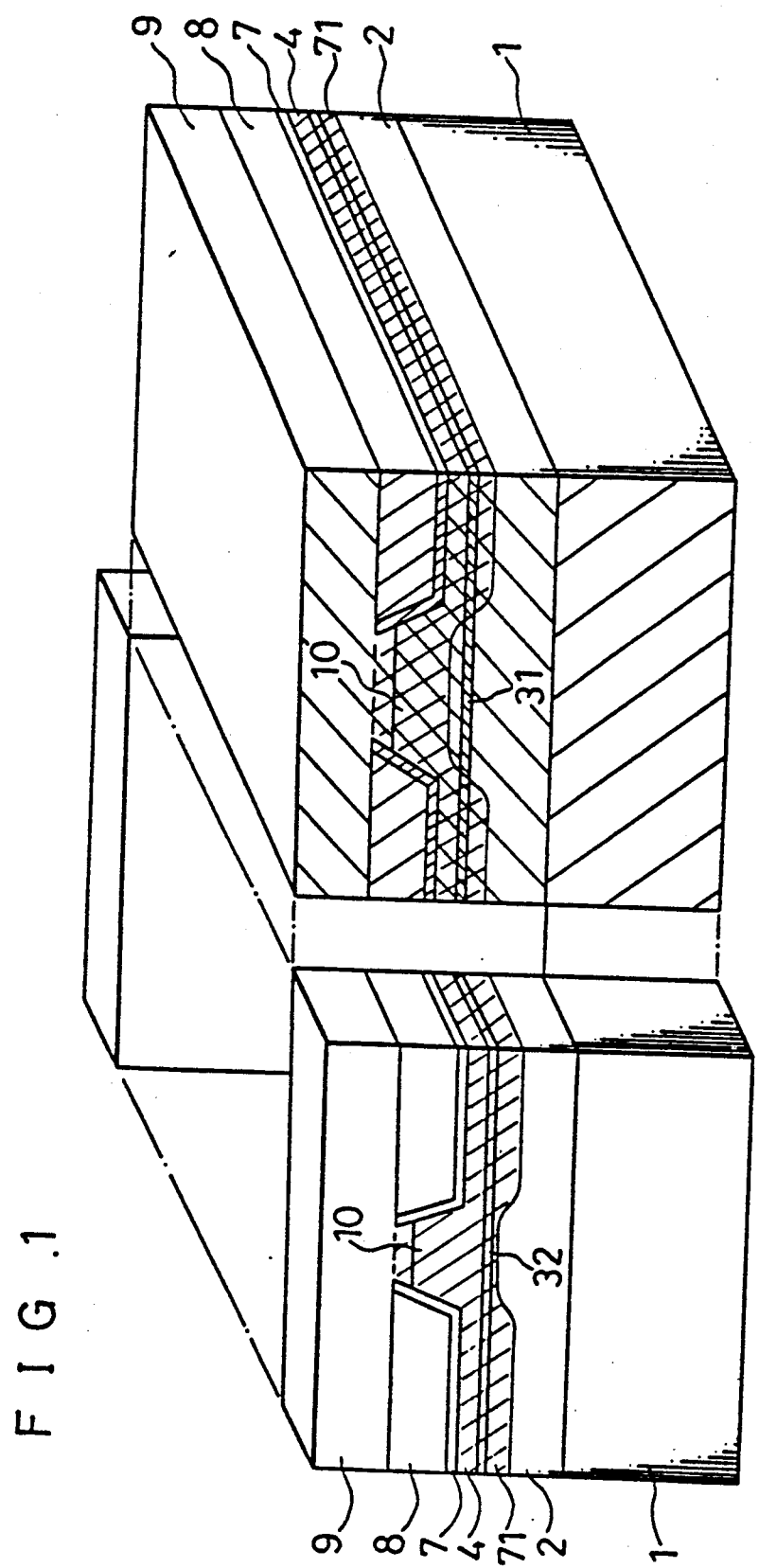
FIG. 1 is a diagram showing a semiconductor laser device according to a first embodiment of the present invention.
Figure 6:
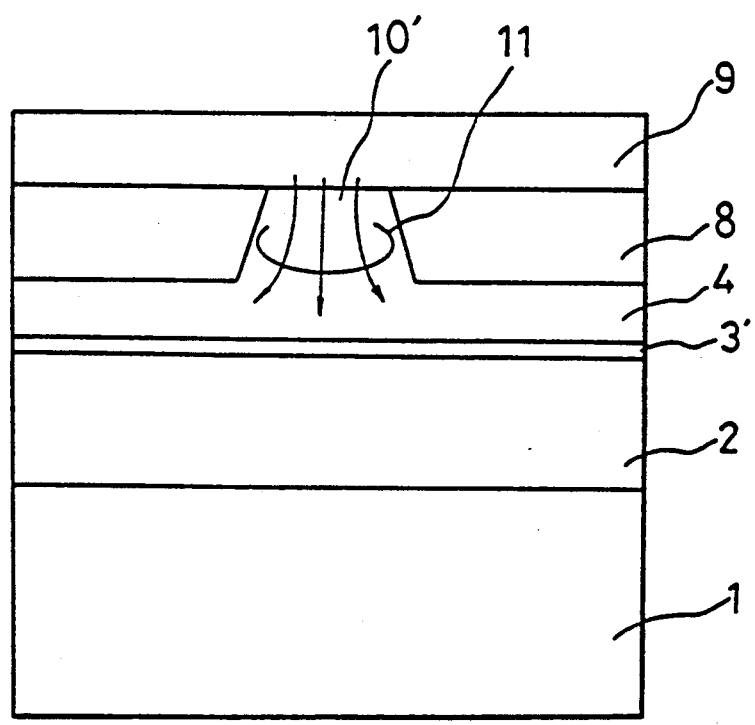
FIG. 6 is a cross sectional view showing a prior art semiconductor laser device.
Figure 7:
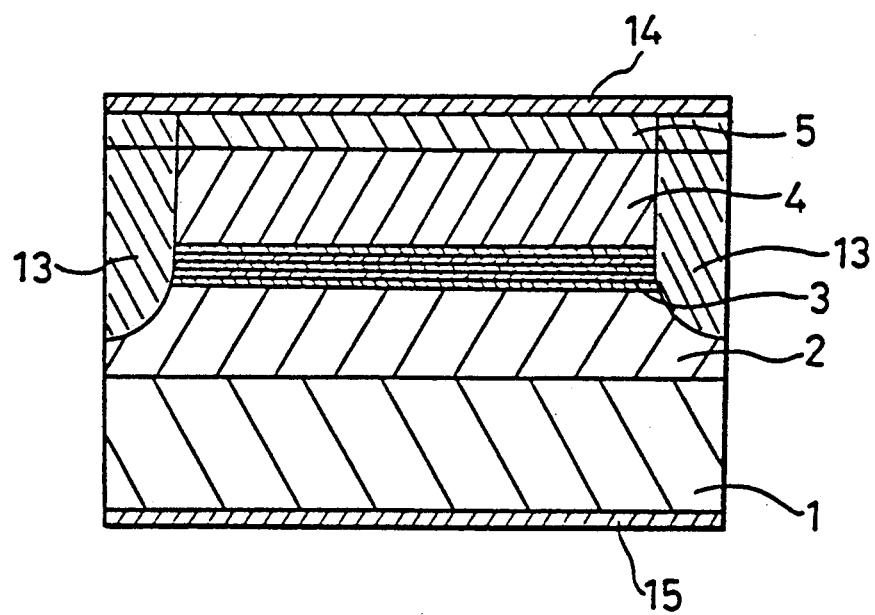
FIG. 7 is a diagram showing a prior art semiconductor laser device in which a portion of the quantum well active layer at the neighborhood of the laser facet is disordered to produce a window structure.

FIG. 1 shows a first embodiment of the present invention. In FIG. 1, the same reference numerals designate the same or corresponding elements as those shown in FIG. 6. Reference numeral 31 designates an active layer comprising an AlGaAs series multi-quantum well active layer disposed on the first cladding layer 2. Reference numeral 71 designates a diffusion region into which p type dopants have been diffused. Reference numeral 32 designates an active layer in which the multi-quantum well layer is disordered by the diffusion of p type dopants, provided on the first cladding layer 2.

The device will operate as follows.

Figure 4:
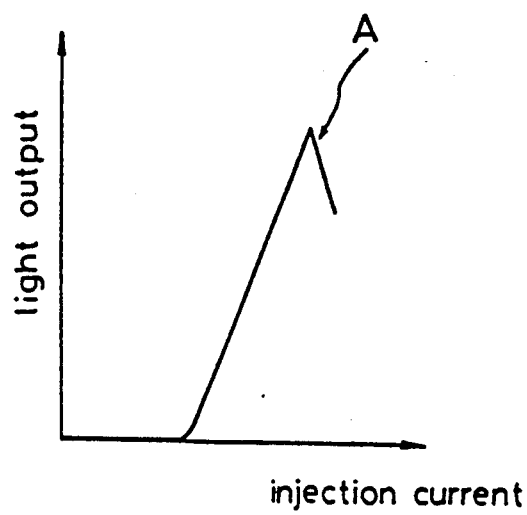
FIG. 4 is a diagram showing a light output vs injection current characteristic of a prior art semiconductor laser device.
Figure 5:
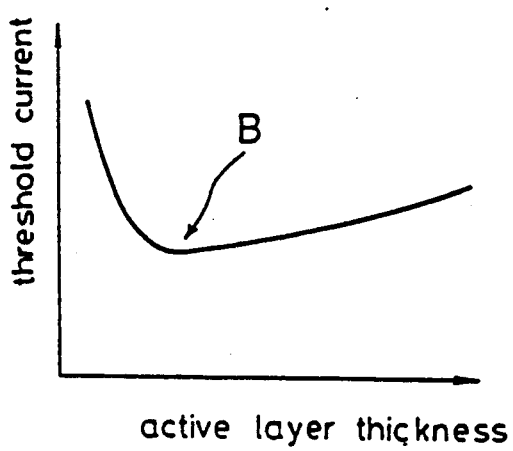
FIG. 5 is a diagram showing a threshold current vs active layer thickness for a prior art semiconductor laser.

A bias is applied between the n type GaAs substrate 1 and the p type GaAs contact layer 9 in such a direction that the p type GaAs contact layer 9 is at plus voltage, and an injection current is increased thereby to start the laser oscillation. The wavelength of the laser light is determined by the optical energy band gap of the MQW active layer 31 inside the laser device and the laser light is not absorbed by the active layer 32 at the laser facet which is disordered, and the COD level shown by A in FIG. 4 is greatly increased.

The production process will be described.

FIG. 2(a) to 2(g) show the production process of the semiconductor laser device of FIG. 1.

Figure 3A:
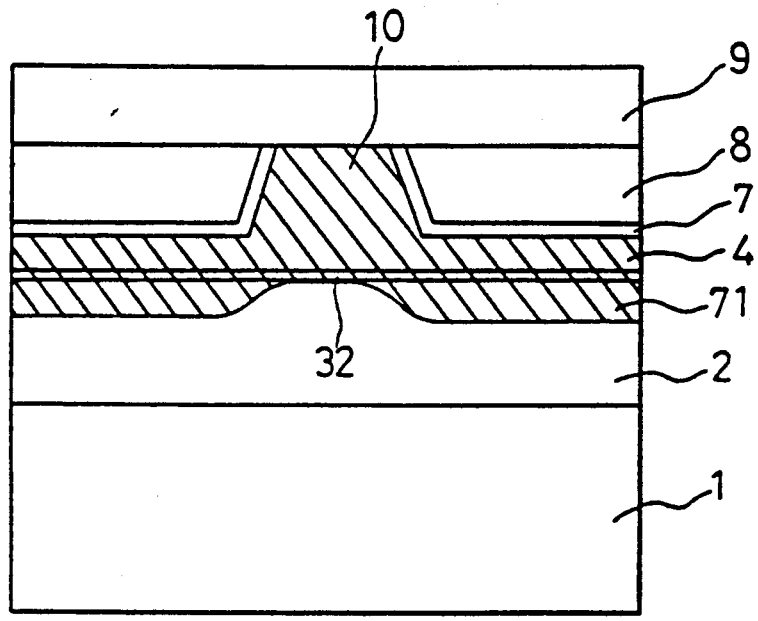
FIGS. 3(a) and 3(b) are diagrams illustrating diffusion of p type dopants at the cavity facet and inside the laser in the production process of FIG. 2.
Figure 3B:
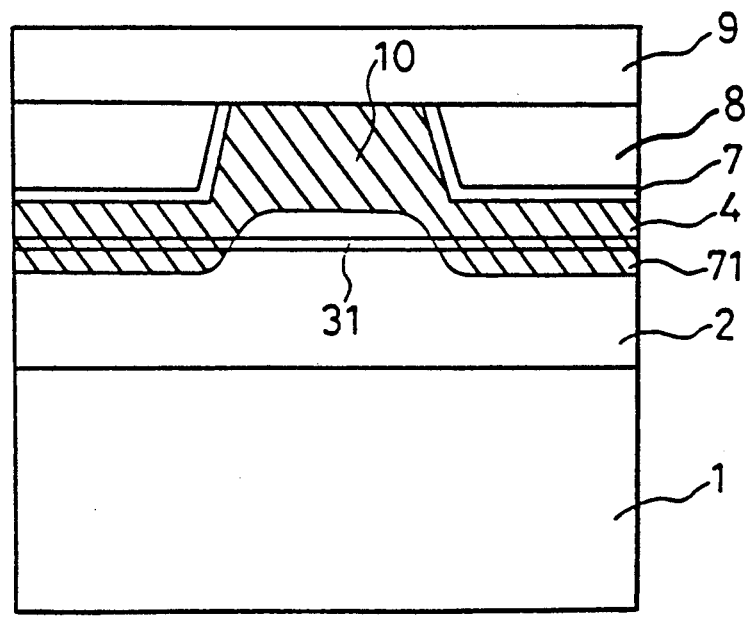

An n type $Al_xGa_{1-x}As$ first cladding layer 2, an intrinsic $Al_yGa_{1-y}As/Al_zGa_{1-z}As$ (y<z<x) multi quantum well layer 3, a p type $Al_xGa_{1-x}As$ second cladding layer 4, and a p type GaAs cap layer 5 are respectively grown on an n type GaAs substrate 1 shown in FIG. 2(a) by a first epitaxial growth process as shown in FIG. 2(b). Thereafter, as shown in FIG. 2(c), an amorphous film 6 is deposited on the p type GaAs cap layer 5. Thereafter, as shown in FIG. 2(d), amporhous film 6 is etched in a stripe shape having a narrower width at the laser device facet than remote therefrom. The amorphous film 6 stripe shape is used as an etching mask for etching the p type $Al_xGa_{1-x}As$ second cladding layer from the wafer surface as shown in FIG. 2(e). A second epitaxial growth is carried out with the remaining amphorous film 6, as a selective mask, and a p type GaAs buffer layer 7 to containing p type dopants and an n type GaAs current blocking layer 8 are grown on a wafer surface except on the top surface of the stripe ridge of the p type GaAs cap layer 5. Herein, because the cladding layer 4 has an impurity concentration of about $5 \times 10^{17}$ to $1 \times 10^{18}$ cm$^{-3}$, the p type GaAs buffer layer 7 is doped to a concentration of about $1 \times 10^{19}$ cm$^{-3}$ which is one order of magnitude higher. In this embodiment, MOCVD is employed in growing the p type GaAs buffer layer 7 and n type GaAs current blocking layer 8. In the MOCVD method, there is no growth on the amorphous film 6 at all, and selective growths as shown in FIG. 2(f). After removing the amorphous film 6, a third epitaxial growth, as shown in FIG. 2(g), a p type GaAs contact layer 9 is grown on the upper surface of the stripe and the n type GaAs current blocking layer 8. In this embodiment, in the second and third epitaxial growth processes, p type dopants diffuse from the p type GaAs buffer layer to layers of tower doping concentration. Thereafter, in the neighborhood, of the laser diode facet having a narrower width than the stripe ridge 10 remote from the facet, the p type dopants are diffused including in the second cladding layer 4 and the cap layer 5, to the active layer 3 as shown in FIG. 3(a), and the multi quantum well layer is disordered. Inside the laser device where the stripe ridge 10 is wider on the contrary, the diffusion of p type dopants does not reach the active layer 3 directly below the ridge 10 as shown in FIG. 3(b). Thus, a semiconductor laser device shown in FIG. 1 can be realized by quite a simple process. Further in this embodiment, since an MOCVD method is employed in the second and third epitaxial growth processes, the configuration of ridge can be determined even after growing the p type GaAs cap layer 9, and determination of the cleavage positions during the chip separation is simplified for production at a high yield.

While in the above-illustrated embodiment p type dopants diffuse at the same time as the epitaxial crystal growth, the p type dopants may be diffused using a diffusion furnace after growing a buffer layer 7. By this method, the diffusion region can be produced with a high controllability.

As is evident from the foregoing description, according to the present invention, a semiconductor laser device includes an n type first cladding layer and an n type or p type or intrinsic multi quantum well active layer successively grown on an n type substrate, a p type second cladding layer having a stripe ridge in the cavity length direction and having a relatively narrow width in the neighborhood of cavity facet and a relatively wide width inside the laser disposed on the active layer, a p type buffer layer containing a higher concentration of p type impurities than the second cladding layer disposed on the second cladding layer except at the stripe ridge, an n type current blocking layer disposed on the buffer layer, and a p type contact layer disposed on the stripe ridge of the second cladding layer and the current blocking layer. Further, the multi quantum well layer, except directly below the stripe ridge, is disordered by diffusion of p type dopants from the p type buffer layer. Therefore, the band gap energy is increased to a value higher than the photon energy which is amplified by the active layer comprising a multi quantum well layer inside the laser device, and the photons are not absorbed at the laser facet and COD is not likely to occur.

What is claimed is:

1. A semiconductor laser device comprising:
   an n type substrate;
   an n type first cladding layer and a multi quantum well active layer successively grown on said n type substrate;
   a p type second cladding layer having a stripe ridge with a top surface opposite said substrate and a relatively narrow width in the neighborhood of a facet of the laser and a relatively wide width inside the laser disposed on said active layer;
   a p type buffer layer containing a higher concentration of p type dopants than said second cladding layer and disposed on said second cladding layer except on the top surface of said stripe ridge;
   a n type current blocking layer disposed on said buffer layer; and
   a p type contact layer disposed on the top surface of said stripe ridge and said current blocking layer wherein said multi quantum well layer, except directly opposite the relatively wide width of said stripe ridge remote from the facet, is disordered by diffusion of p type dopants from said p type buffer layer.

2. A semiconductor laser device as defined in claim 1 wherein said p type dopants are Zn.

3. A semiconductor laser device as defined in claim 1 which comprises AlGaAs series semiconductor.dir

* * * * *